(12) United States Patent
Kasa

(10) Patent No.: US 6,407,957 B2
(45) Date of Patent: Jun. 18, 2002

(54) SEMICONDUCTOR MEMORY

(75) Inventor: Yasushi Kasa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/725,278

(22) Filed: Nov. 29, 2000

(30) Foreign Application Priority Data

Mar. 9, 2000 (JP) ..................................... 2000-064580

(51) Int. Cl.[7] ............................................... G11C 7/02
(52) U.S. Cl. ..................................... 365/210; 365/185.2
(58) Field of Search ............................ 365/210, 230.06, 365/185.2, 63

(56) References Cited

U.S. PATENT DOCUMENTS

| | | | | |
|---|---|---|---|---|
| 5,383,155 A | * | 1/1995 | Ta | 365/210 |
| 5,394,371 A | * | 2/1995 | Hotta | 365/210 |
| 5,748,556 A | * | 5/1998 | Iyengar | 365/230.06 |
| 6,034,908 A | * | 3/2000 | Becker et al. | 365/210 |

* cited by examiner

*Primary Examiner*—Trong Phan
(74) *Attorney, Agent, or Firm*—Arent Fox Kintner Plotkin & Kahn, PLLC

(57) ABSTRACT

Data lines are wired next to each other. A sense amplifier receives the data and outputs an amplified signal. Dummy data lines are laid out along both sides of a data bus consisting of the data lines. The dummy data lines have the same voltage variation as the data lines during a read operation of the data stored in the memory cells. This reduces the potential differences between the data lines and the dummy data lines during a read operation. As a result, the outer data lines and the inner data lines become nearly equal to each other in coupling characteristics, and the lengths of time it takes for the data read to each of the data lines to rise become almost equal to each other. Since the data lines have smaller fluctuations in rising time, the read time (access time) is accelerated.

7 Claims, 10 Drawing Sheets

SEMICONDUCTOR MEMORY

BACKGROUND OF THE INVENTION

1. Field of the Invention

The present invention relates to a semiconductor memory having a memory cell, and more particularly to a technology for reading data stored in a memory cell at high speed.

2. Description of the Related Art

Among the known semiconductor memories having memory cells are flash memories, EPROMs, DRAMs, and SDRAMs.

FIG. 1 schematically shows a read-operation-related circuit in a flash memory.

A flash memory includes an address buffer 2, an X-decoder 4, a memory cell array 6, a Y-decoder 8, a sense amplifier 10, an output buffer 12, and a control circuit 14.

The address buffer 2 receives an address signal from the chip exterior, and outputs the received address signal to the X-decoder 4 and the Y-decoder 8. The X-decoder 4 and the Y-decoder 8 select a word line WL and a bit line BL corresponding to the address signal, respectively. The Y-decoder 8 also has a switching function of connecting the bit line BL to the sense amplifier 10. The memory cell array 6 has a plurality of memory cells MC arranged in a matrix. The sense amplifier 12 amplifies read data transmitted from a memory cell MC through the bit line BL and the Y-decoder 8, and outputs-the resultant to the output buffer 12. The output buffer 12 outputs the amplified read data to the chip exterior. The control circuit 14 receives a control signal from the chip exterior, and controls the address buffer 2, the sense amplifier 10, and the output buffer 12 in accordance with the received control signal.

Though not shown specifically, a multi-bit product having a plurality of input/output terminals includes a plurality of Y-decoders 8, sense amplifiers 10, and output buffers 12 corresponding to the input/out put terminals. Here, a plurality of memory cells MC are selected by predetermined word lines WL, and a plurality of sense amplifiers 10 corresponding to the individual input/output terminals are operated. Then, the read data (in a plurality of bits) is simultaneously output from the output buffers 12.

FIG. 2 shows the essential parts of a flash memory having its memory cell array divided into a plurality of blocks BLK), BLK1, BLK2, and so on. This flash memory has n input/output terminals.

Each block BLK has a plurality of Y-decoders 8 corresponding to the individual input/output terminals. The Y-decoders 8 in the same block BLK are connected to sense amplifiers 10 through data line switches 16 and data lines DATAB (0) to DATAB (n–1), respectively. In other words, through the intervention of the data lines DATAB, the plurality of blocks BLK share the sense amplifiers 10 that are formed for the individual input/output terminals. The data line switches 16 are controlled by block decoders 18. The data lines DATAB (0) to DATAB (n–1) are wired next to and in parallel with each other. These data lines DATAB (0) to DATAB (n–1) constitute data bus DBUS.

In this flash memory, read data to be output from a predetermined block BLK is selected by a block decoder 18 and transmitted to the data bus DBUS. The read data transmitted to the data bus DBUS is amplified by the sense amplifiers 10.

FIG. 3 shows an example of a sense amplifier 10.

A sense amplifier 10 has an inverter 10a, an nMOS transistor 10b, and a load 10c. The input of the inverter 10a and the source of the nMOS transistor 10b are connected to a data line DATAB. The output of the inverter 10a is connected to the gate of the nMOS transistor 10b so that the inverter 10a and the nMOS transistor 10b form a feedback loop. The drain of the nMOS transistor 10b and one end of the load 10c are connected to an output node OUT. The other end of the load 10c is connected to a power supply line VCC. This type of sense amplifiers 10 is generally referred to as "cascode type."

FIG. 4 shows voltage variation on a data line DATAB in read operations.

Initially, a bit line BL and the data line DATAB are charged up. The bit line BL and the data line DATAB rise from 0 V to approximately 1 V in voltage. Then, in accordance with the state stored in the memory cell MC, electric current flows through the bit line BL and the data line DATAB to cause voltage variation on the data line DATAB.

When the memory cell MC stores "0," no current flows through the bit line BL and the data line DATAB. The inverter 10a shown in FIG. 3 becomes low in output voltage, and the nMOS transistor 10b becomes high in source-to-drain resistance. As a result, a current supply from the load 10c turns the output node OUT to high level.

When the memory cell MC stores "1," a current flows through the bit line BL and the data line DATAB. The data line DATAB drops in voltage, making the output voltage of the inverter 10a high. The nMOS transistor 10b becomes low in source-to-drain resistance. As a result, a current supplied from the load 10c is fed to the data line DATAB through the nMOS transistor 10b, thereby effecting the feedback control on the inverter 10a. This turns the output node OUT to low level.

Here, the voltage difference on the data line DATAB between the "0" read and the "1" read is as small as several tens of milli-volts.

By the way, the sense amplifiers 10 described above need to detect a small voltage on the data lines DATAB. To prevent a malfunction of the sense amplifiers 10, the data lines DATAB must be wired so as not to be affected by the coupling from other adjacent signal lines. This measure is important particularly when the sense amplifiers 10 are shared among a plurality of blocks BLK as described above, since the data lines DATAB become greater in wiring length.

Specifically, the layout design is made with consideration given to the following respects:

(1) Prevent signals that vary during a read operation (clock signal and the like) from adjoining the data lines DATAB
(2) Provide greater wiring spacings between the data lines DATAB and other adjacent signals
(3) Shield the data lines DATAB The above-mentioned respect (2), however, brings about a problem of increased layout areas.

FIG. 5 shows an example of layout taking the above-mentioned respect (3) into account.

In this example, ground lines VSS are laid out along both sides of the data bus DBUS. The ground lines VSS (0 V) have no voltage variation during read operations.

FIG. 6 shows a read operation by the circuit shown in FIG. 5.

A difference in potential between a data line DATAB and a ground line VSS increases as the data line DATAB rises in voltage. An electric charge corresponding to the potential difference is stored into a parasitic capacitance formed between the two lines. The outer the data line DATAB, the greater the amount of charge stored is. Thus, the outer data lines DATAB (0) and DATAB (n–1) adjacent to the ground lines VSS tend to lag in rise.

Meanwhile, the inner data lines DATAB (1) to DATAB (n−2) have smaller potential differences with their adjacent data lines DATAB. This means less transfer of charge to parasitic capacitances formed among these data lines DATAB (1) to DATAB (n−2). As a result, the inner data lines DATAB (1) to DATAB (n−2) rise at high speed and at the same timing.

The read time (access time) is determined according to the data established the latest in the multi-bit read data. For this reason, the shielding of the data lines DATAB by the ground lines VSS has been an obstacle to performing high-speed operations.

SUMMARY OF THE INVENTION

An object of the present invention is to provide a semiconductor memory capable of reading data stored in a memory cell at high speed.

According to one of the aspects of the semiconductor memory in the present invention, the semiconductor memory includes a plurality of data lines, a sense amplifier, and dummy data lines. The data lines are wired next to each other, and transmit data read from memory cells. The sense amplifier receives the data and outputs an amplified signal. The dummy data lines are laid out along both sides of a data bus consisting of the data lines. The dummy data lines have the same voltage variation as the data lines during a read operation of the data stored in the memory cells. This reduces the potential differences between the data lines and the dummy data lines during a read operation. That is, the amounts of charge stored into parasitic capacitances formed between the data lines and the dummy data lines during a read operation are minimized. As a result, the outer data lines and the inner data lines become nearly equal to each other in coupling characteristics, and the lengths of time it takes for the data read to each of the data lines to rise become almost equal to each other. Since the data lines have smaller fluctuations in rising time, the read time (access time) is accelerated.

According to another aspect of the semiconductor memory in the present invention, the semiconductor memory includes a control circuit for operating the same as the sense amplifier operates during a read operation. The dummy data lines are connected to the control circuit. Therefore, it is easy for the dummy data lines to have the same voltage variation as the data lines during a read operation.

According to another aspect of the semiconductor memory in the present invention, each dummy data line is formed of a plurality of wiring pieces laid out along both sides of the data bus. Each of the wiring pieces is respectively connected to one of the data lines. The dummy data lines, because it is formed of the wiring pieces individually connected to the plurality of data lines, have the same voltage variation as the data lines. Therefore, without using any special control circuit, the amounts of charge stored into the parasitic capacitances formed between the data lines and the dummy data lines are minimized to accelerate the read time (access time).

According to another aspect of the semiconductor memory in the present invention, each wiring piece is connected to a data line, and the totals of the wiring lengths of the wiring pieces are made equal between each data line. Therefore, in the case where, for example, any other wiring is laid out along the outside of each of the dummy data lines, all the data lines equally undergo the influence of that wiring. As a result, the plurality of data lines is prevented from having fluctuations in the lengths of time it takes for data to rise during a read operation. This avoids delay in read time (access time) due to the influence of other adjacent wirings.

According to another aspect of the semiconductor memory in the present invention, the wiring pieces have identical lengths and are laid out in at regular intervals. Therefore, the totals of wiring lengths of the wiring pieces connected to individual data lines can be easily made equal between the data lines. In layout designing, identical wiring pieces have only to be laid out repeatedly. This facilitates the layout design.

According to another aspect of the semiconductor memory in the present invention, a ground line or a wiring to be set at a ground voltage during the read operation is laid out along the outside of each of the dummy data lines. Therefore, in the case where, for example, any other wiring is laid out along the outside of each of the dummy data lines, the data lines are prevented from receiving influences from that wiring.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the drawings.

Figure 7:
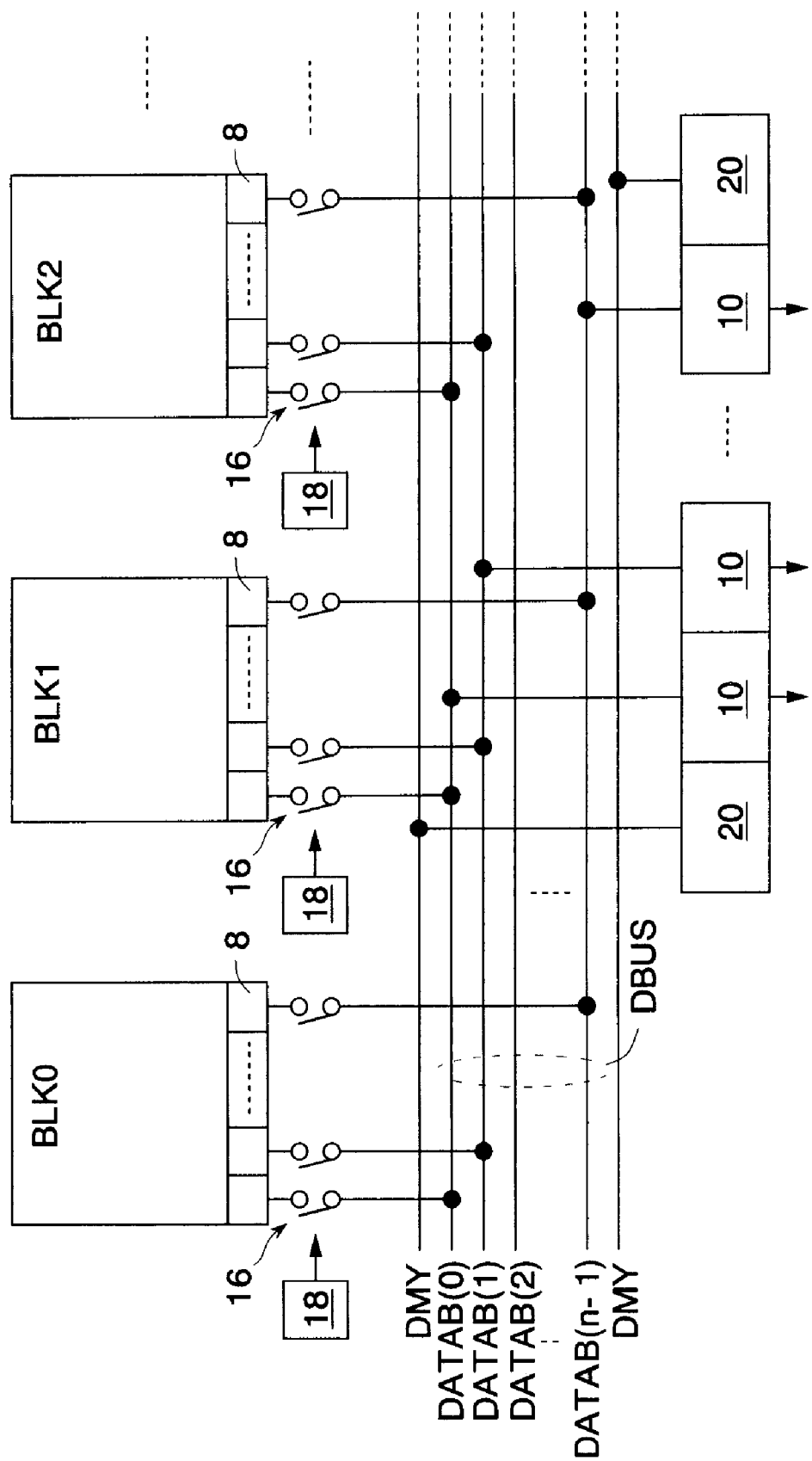
FIG. 7 is a block diagram showing the essential parts of a first embodiment of the semiconductor memory according to the present invention.

FIG. 7 shows the essential parts of a first embodiment of the semiconductor memory according to the present invention. The same components as those described in the related art will be designated by identical reference numbers, and detailed description will be omitted of these components.

Figure 1:
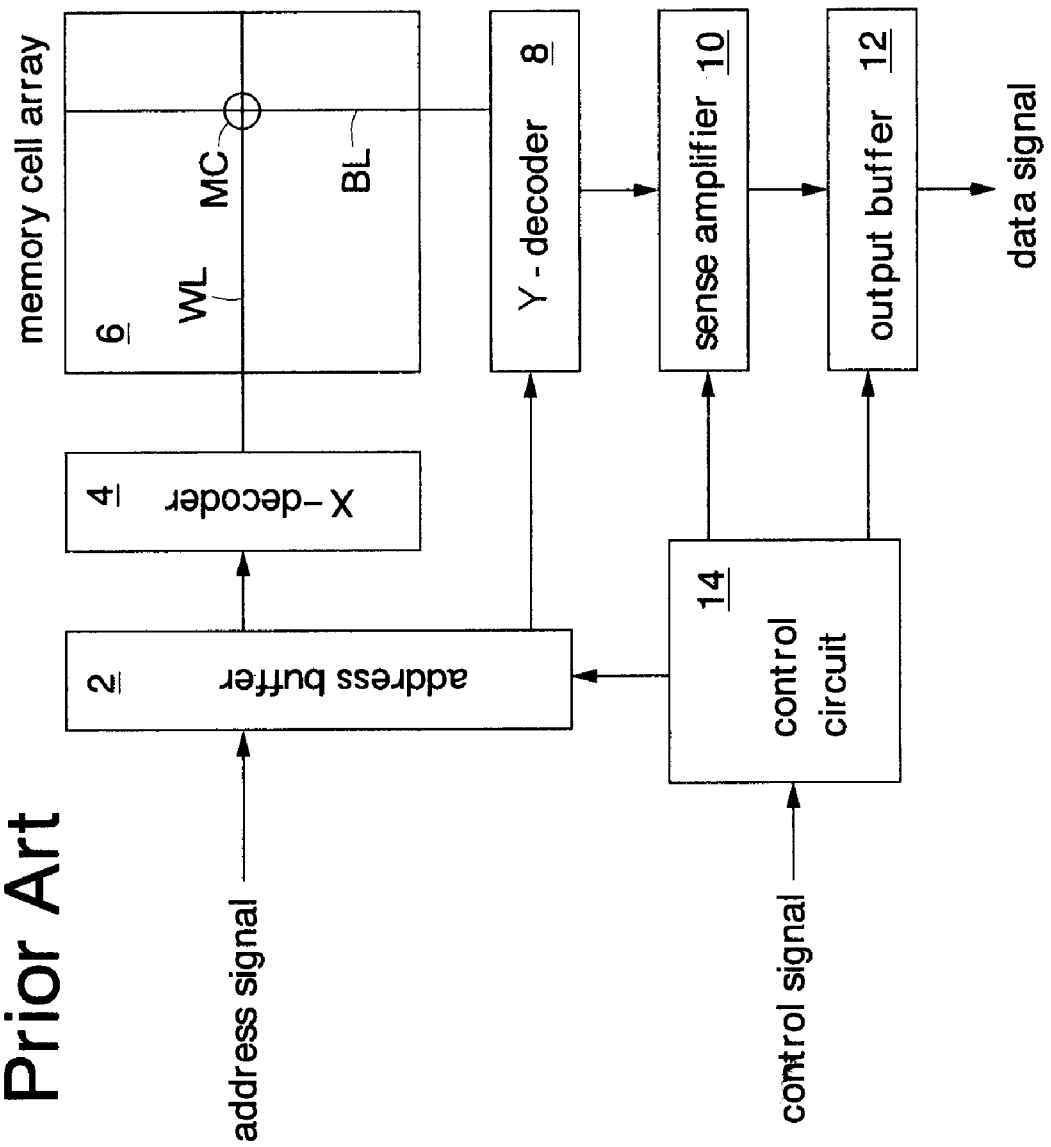
FIG. 1 is a block diagram schematically showing a conventional flash memory.

This semiconductor memory is formed as a flash memory on a silicon substrate by using CMOS processes. The configuration other than that shown in FIG. 7 is identical to that of FIG. 1.

Figure 2:
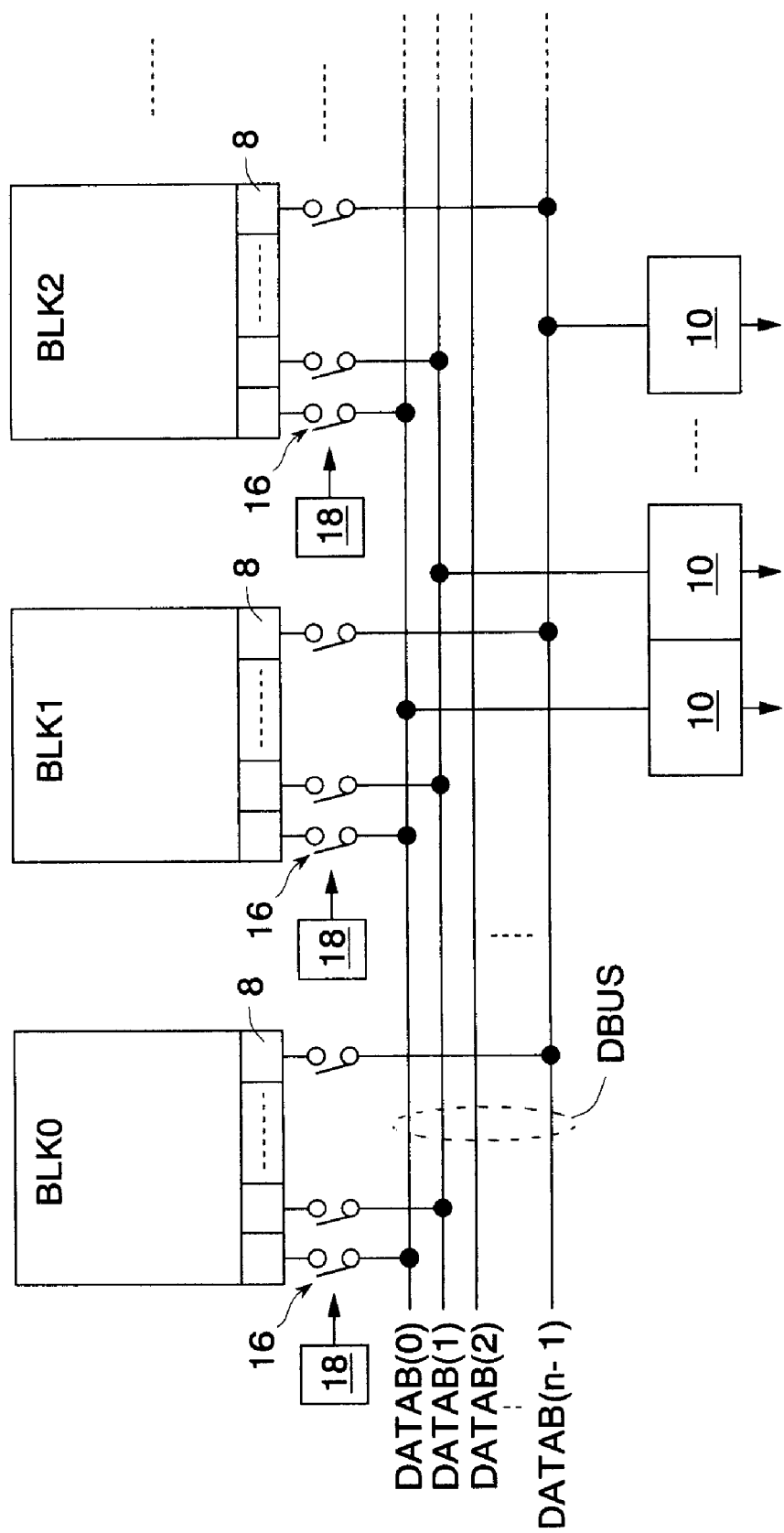
FIG. 2 is a block diagram showing the essential parts of FIG. 1.
Figure 3:
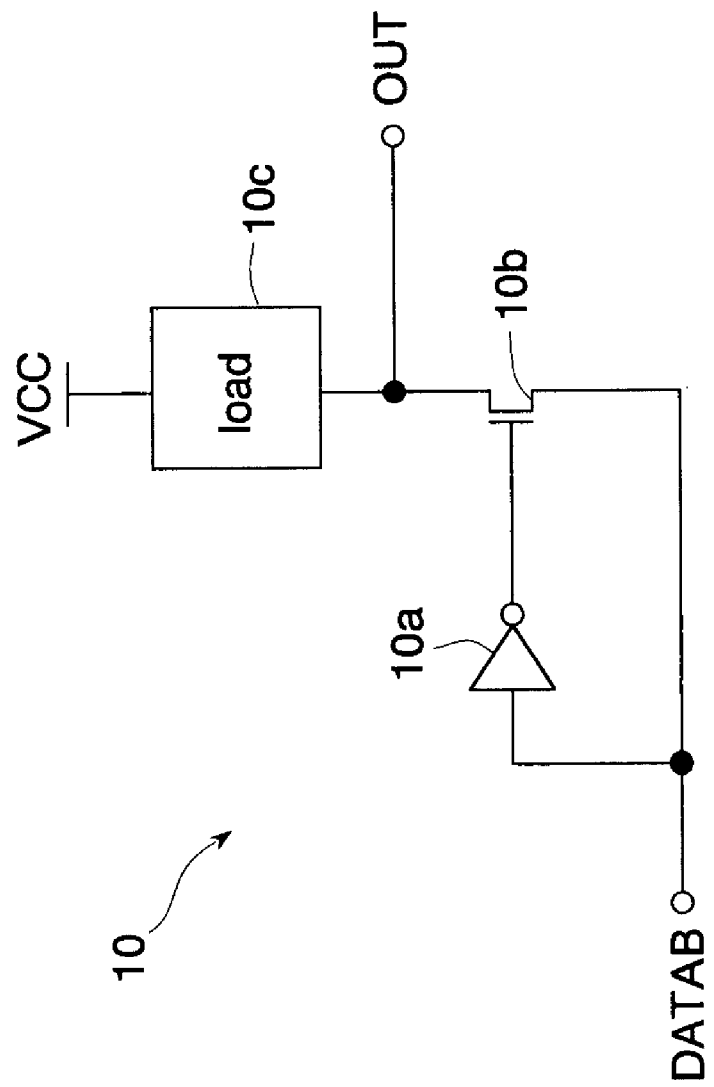
FIG. 3 is a circuit diagram showing a sense amplifier of FIG. 2.
Figure 4:
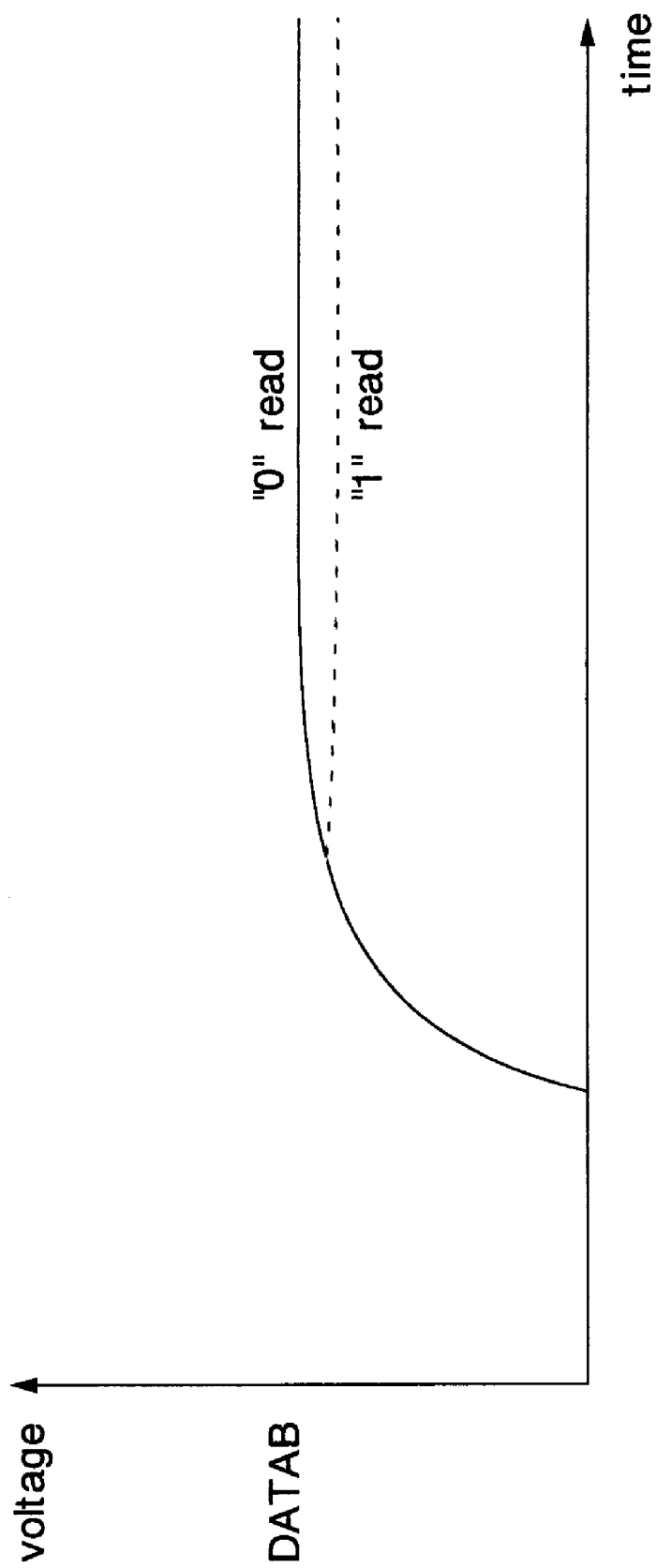
FIG. 4 is a waveform chart showing voltage variation on a data line in conventional read operations.
Figure 5:
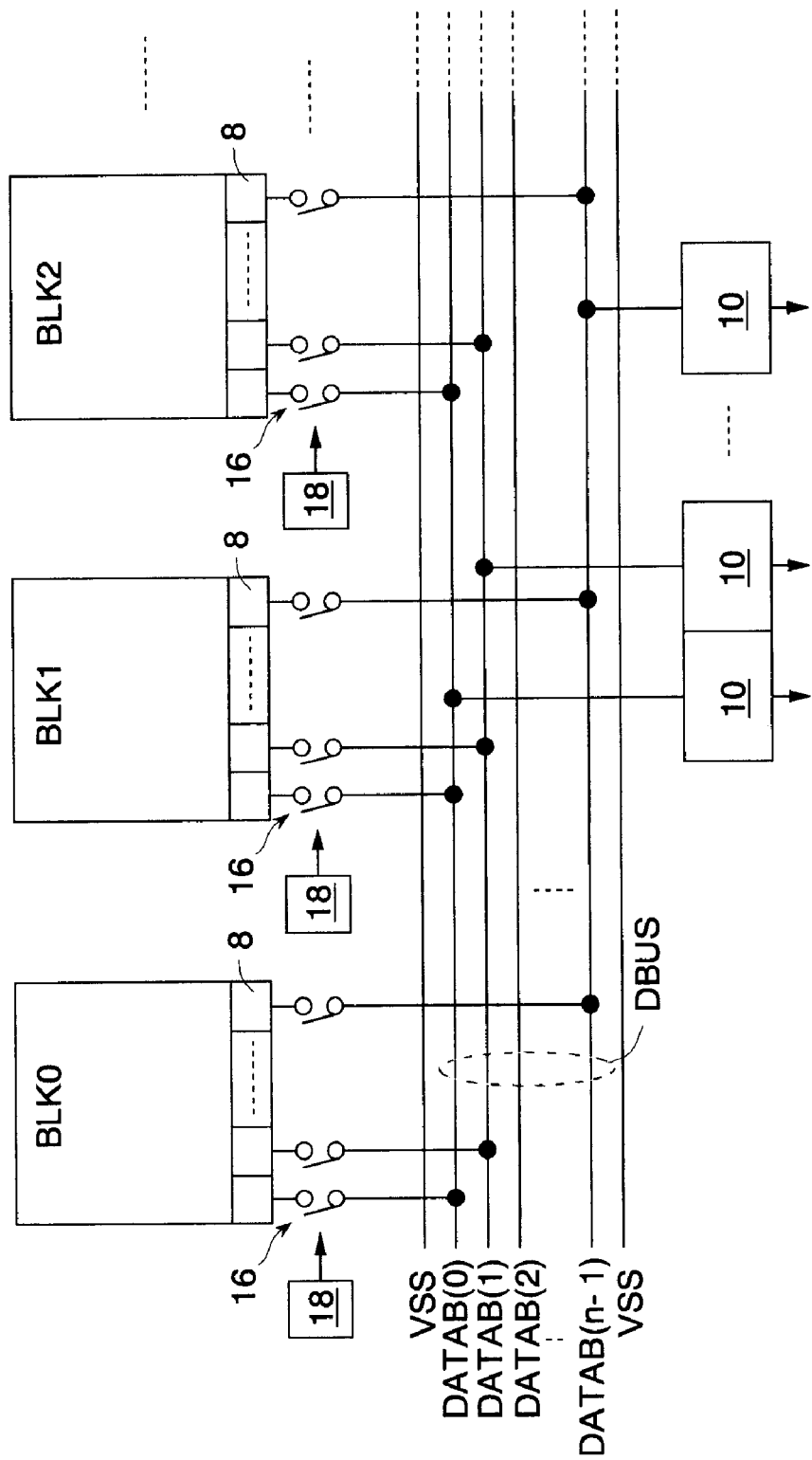
FIG. 5 is a layout diagram showing an example of conventional data lines shielded.
Figure 6:
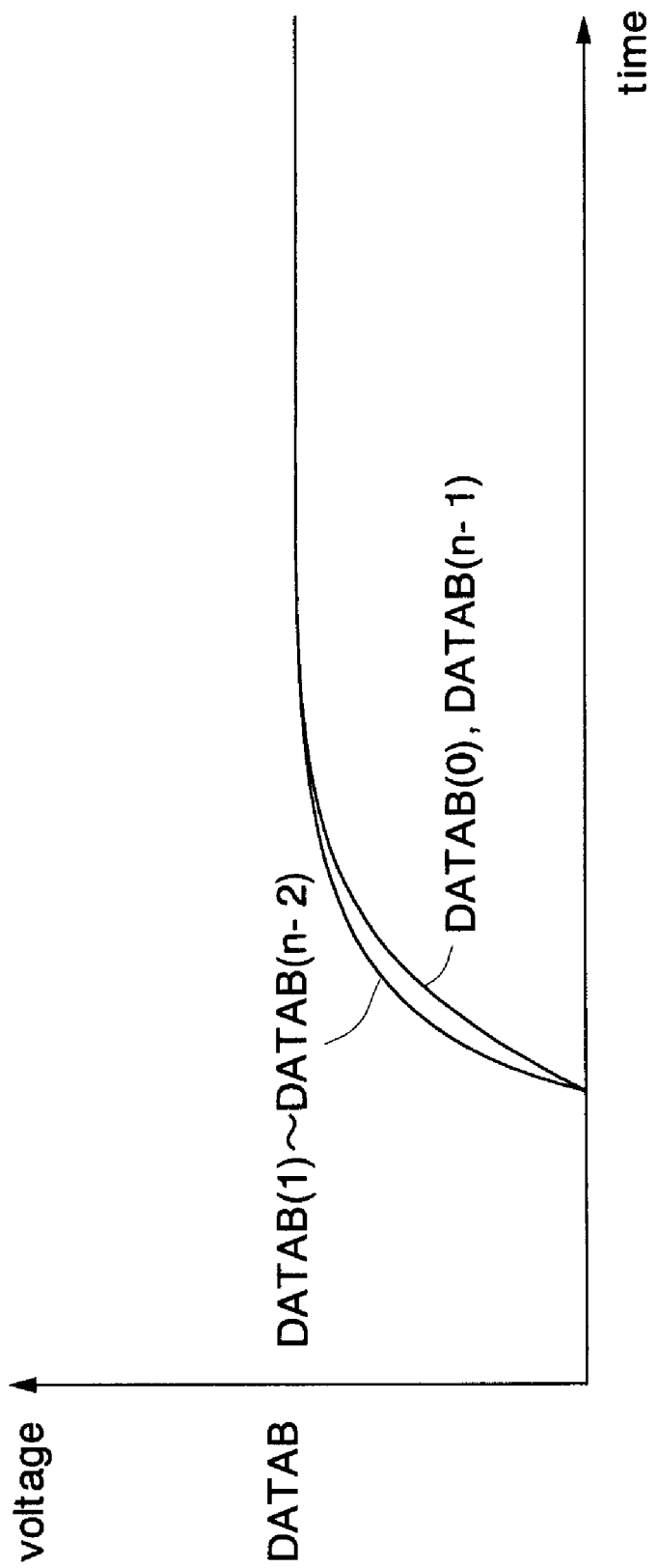
FIG. 6 is a waveform chart showing voltage variation on data lines of FIG. 5 during a read operation.

In this embodiment, dummy data lines DMY are laid out along both sides of the data bus DBUS so as to be parallel to data lines DATAB. The dummy data lines DMY are connected to control circuits 20. The other configuration is the same as that of FIG. 2 described above.

The control circuits 20 are circuits for causing the dummy data lines DMY to have the same voltage variation as those of the data lines DATAB. A control circuit 20 is formed by connecting the output node of a sense amplifier 10 to a dummy load. That is, a control circuit 20 makes almost the same operations as those of a sense amplifier 10 in read operations.

Figure 8:
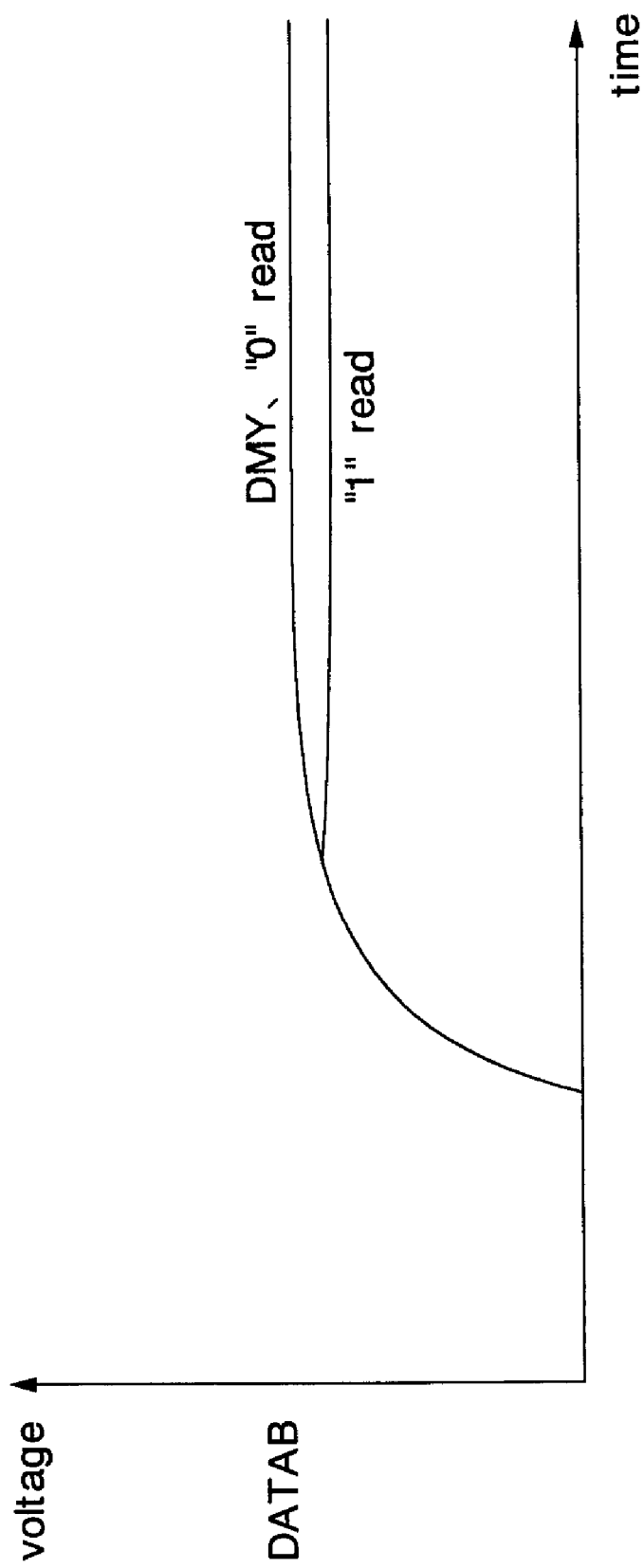
FIG. 8 is a waveform chart showing voltage variation on a data line in read operations.

FIG. 8 shows voltage variation on a data line DATAB in read operations.

In this embodiment, the voltages of the dummy data lines DMY are controlled by the control circuits 20 so that, for example, they have the same voltage variation as those of a "0"-read data line DATAB. Accordingly, the voltage differences between the data lines DATAB and the dummy data lines DMY fall within several tens of milli-volts, which is the voltage difference on a data line DATAB between "0" read and "1" read. In other words, the amounts of charge stored into parasitic capacitances formed between the data lines DATAB (in particular, the data lines DATAB (0) and DATAB (n−1)) and the dummy data lines DMY are minimized. As a result, the outer data lines DATAB (0) and DATAB (n−1) and the inner data lines DATAB (1) to DATAB (n−2) become almost identical to each other in coupling characteristics, whereby the rising times of the data read to the data lines DATAB (0) to DATAB (n−1) become almost uniform. Since the data lines DATAB (0) to DATAB (n−1) have smaller fluctuations in rising time, the read time (access time) is accelerated.

As has been described above, in the semiconductor memory of the present invention, the dummy data lines DMY which have the same voltage variation as those of the data lines DATAB are laid out on both sides of the data bus DBUS. Therefore, the data lines DATAB (0) to DATAB (n−1) can be made equal to each other in rising time to accelerate the read time (access time).

This is particularly effective when the sense amplifiers are shared among a plurality of blocks with greater wiring lengths of data lines DATAB.

Figure 9:
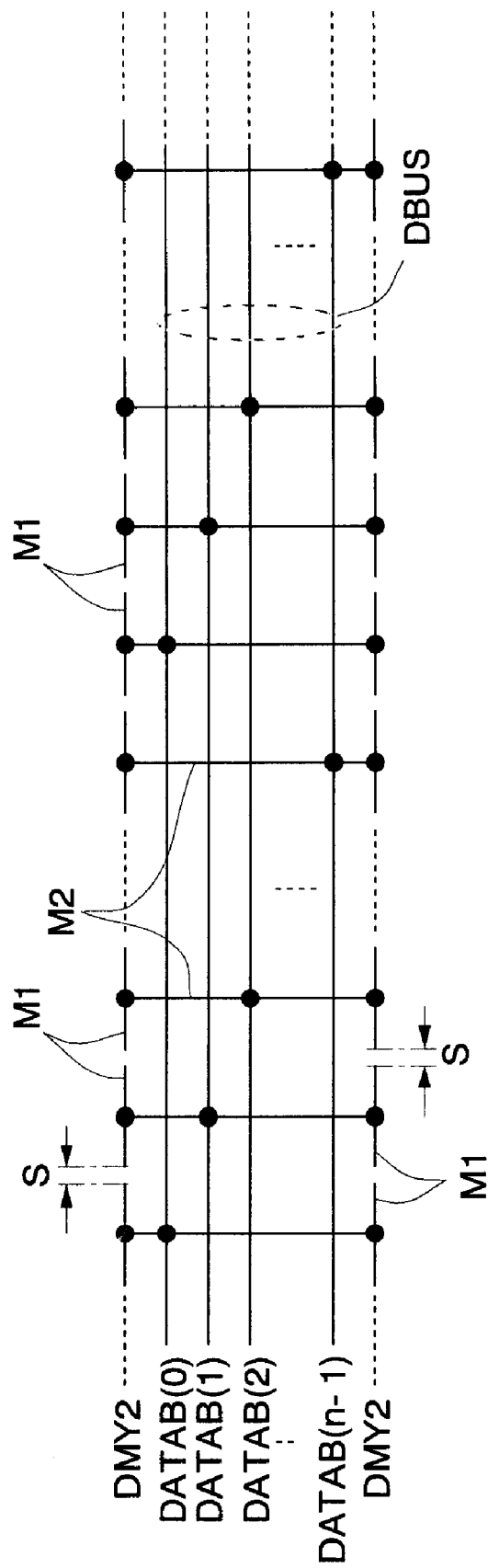
FIG. 9 is a layout diagram showing the essential parts of a second embodiment of the semiconductor memory according to the present invention.

FIG. 9 shows the essential parts of a second embodiment of the semiconductor memory according to the present invention. The same components as those described in the related art and in the first embodiment will be designated by identical reference numbers, and detailed description will be omitted of these components.

This embodiment includes a plurality of wiring pieces M1 laid out on both sides of the data bus DBUS, in parallel with the data lines DATAB at regular intervals S. The wiring pieces M1 are formed out of the same wiring layer as that forming the data lines DATAB. The wiring pieces M1 are connected to the data lines DATAB via wiring M2 that is laid out orthogonal to the data lines DATAB. The wiring M2 is formed of a wiring layer upper that that of the data lines DATAB. That is, the wiring pieces M1 are formed by a uniform layout of the data lines DATAB (0) to DATAB (n−1). Then, these wiring pieces M1 constitute dummy data lines DMY2. The present embodiment has the same configuration as that of the first embodiment except in that the control circuits 20 (FIG. 7) are not arranged, and that the dummy data lines DMY2 are formed out of the data lines DATAB (0) to DATAB (n−1).

In this embodiment, the dummy data lines DMY2 have the same variation as those of the data lines DATAB (0) to DATAB (n−1). Therefore, as in the first embodiment, the amounts of charge stored into parasitic capacitances formed between the data lines DATAB (in particular, the data lines DATAB (0) and DATAB (n−1)) and the dummy data lines DMY are minimized. Besides, the control circuits 20 (FIG. 7) for controlling the dummy data lines DMY2 become unnecessary.

Moreover, the wiring pieces M1 are formed by the uniform layout of the data lines DATAB (0) to DATAB (n−1). Therefore, if any other wiring is laid out along the outside of each of the dummy data lines DMY2, all the data lines DATAB (0) to DATAB (n−1) equally receive the influence of that wiring. This eliminates fluctuations in the rising times of the data lines DATAB (0) to DATAB (n−1) during a read operation. As a result, a delay in read time (access time) due to the influence of adjacent other wiring is avoided.

This embodiment can also offer the same effects as those obtained from the first embodiment described above. Moreover, in this embodiment, the dummy data lines DMY2 are formed by extending the data lines DATAB (0) to DATAB (n−1). Therefore, it is possible to dispense with the control circuits for controlling the dummy data lines DMY2. This allows a reduction in chip size.

Figure 10:
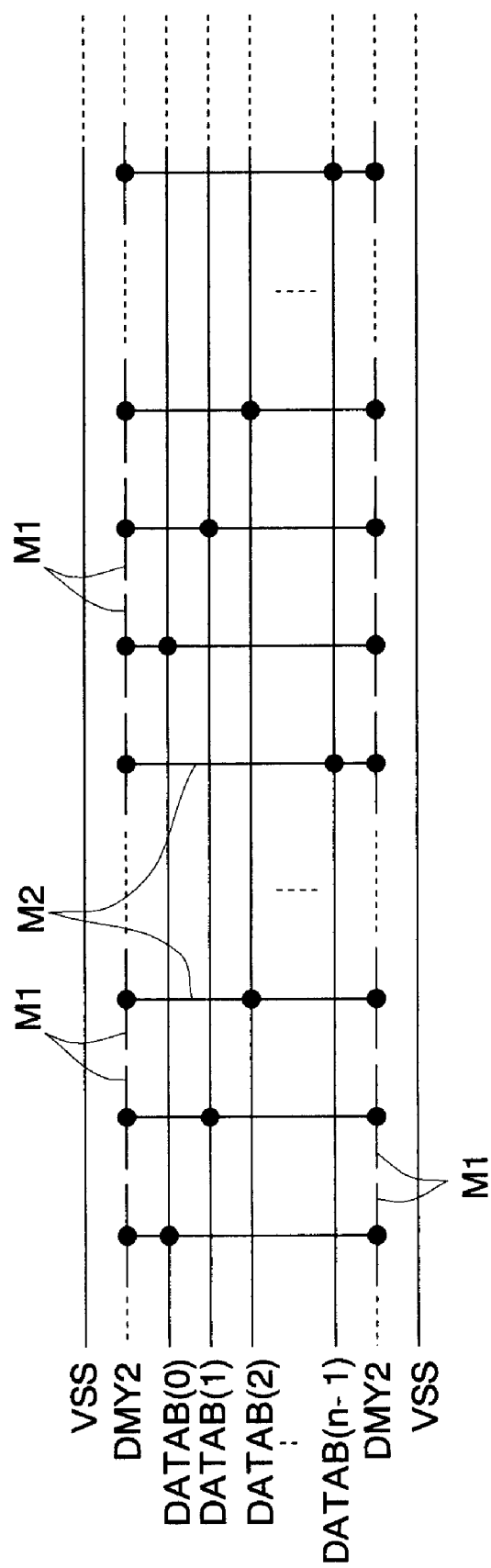
FIG. 10 is a layout diagram showing the essential parts of a third embodiment of the semiconductor memory according to the present invention.

FIG. 10 shows the essential parts of a third embodiment of the semiconductor memory according to the present invention. The same components as those described in the related art and in the foregoing embodiments will be designated by identical reference numbers, and detailed description will be omitted of these components.

This embodiment includes ground lines VSS that are each laid out along the outsides of each of the dummy data lines DMY2. The other configuration is the same as that of the second embodiment.

In this embodiment, the amounts of charge stored into parasitic capacitances formed between the data lines DATAB (0) to DATAB (n−1) and the ground lines VSS become almost uniform. The outer data lines DATAB (0) and DATAB (n−1) and the inner data lines DATAB (1) to DATAB (n−2) have the same coupling characteristics, and hence the data lines DATAB (0) to DATAB (n−1) become equal to each other in rising time. Besides, if any other wiring is laid out along the outside of each of the dummy data lines DMY2, the data lines DATAB (0) to DATAB (n−1) are kept out of the influence of that wiring.

This embodiment can also offer the same effects as those obtained from the first and second embodiments described above.

Incidentally, the first embodiment described above has dealt with the case where the voltage variation of the dummy data lines DMY are made equal to those of a "0"-read data line DATAB. However, the present invention is not limited to such embodiment. For example, the voltage variation may be made equal to those of a "1"-read data line DATAB. Moreover, the voltage variation of the dummy data lines DMY may be set to between those of "0"-read and "1"-read data lines DATAB.

The embodiments described above have dealt with the cases where the present invention is applied to a flash memory. However, the present invention is not limited to such embodiments. For example, the present invention may be applied to an EPROM (Electrically Programmable ROM) or a mask ROM. Moreover, the present invention may be applied to a system LSI implementing a memory core of a flash memory.

The third embodiment described above has dealt with the case where the ground lines VSS are each laid out along the outside of each of the dummy data lines DMY2. However, the present invention is not limited to such an embodiment. For example, there may be arranged 0-V testing signals and the like.

The invention is not limited to the above embodiments and various modifications may be made without departing from the spirit and the scope of the invention. Any improvement may be made in part or all of the components.

What is claimed is:

1. A semiconductor memory comprising:
   a plurality of data lines wired next to each other, for transmitting data read from memory cells;
   a sense amplifier for receiving said data and outputting an amplified signal; and
   dummy data lines laid out along both sides of a data bus consisting of said data lines, and having the same voltage variation as said data lines during a read operation of said data stored in said memory cells.

2. A semiconductor memory according to claim 1, further comprising a control circuit for operating the same as said sense amplifier operates during said read operation, wherein
   said dummy data lines are connected to said control circuit.

3. A semiconductor memory according to claim 1, wherein:
   said dummy data lines are formed of a plurality of wiring pieces laid out along both sides of said data bus; and
   each of said wiring pieces are respectively connected to one of said data lines.

4. A semiconductor memory according to claim 3, wherein the totals of wiring lengths of said wiring pieces connected to each of said data lines are the same in each of said data lines.

5. A semiconductor memory according to claim 4, wherein said wiring pieces have identical lengths and are laid out in at regular intervals.

6. A semiconductor memory according to claim 3, wherein a ground line is laid out along the outside of each of said dummy data lines.

7. A semiconductor memory according to claim 3, wherein a wiring to be at ground voltage during said read operation is laid out along the outside of each of said dummy data lines.

* * * * *